United States Patent
Yamazaki et al.

(10) Patent No.: US 9,461,615 B2
(45) Date of Patent: *Oct. 4, 2016

(54) VIBRATOR ELEMENT, VIBRATOR, OSCILLATOR, ELECTRONIC APPARATUS, AND MOVING OBJECT

(71) Applicant: SEIKO EPSON CORPORATION, Tokyo (JP)

(72) Inventors: Takashi Yamazaki, Shiojiri (JP); Akihiko Ebina, Fujimi-machi (JP); Tsuyoshi Tabata, Kawaguchi (JP); Hidekazu Yanagisawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/330,184

(22) Filed: Jul. 14, 2014

(65) Prior Publication Data

US 2015/0022275 A1 Jan. 22, 2015

(30) Foreign Application Priority Data

Jul. 19, 2013 (JP) ................. 2013-150213

(51) Int. Cl.
*H03B 5/32* (2006.01)
*H01L 41/047* (2006.01)
(Continued)

(52) U.S. Cl.
CPC ............ *H03H 9/17* (2013.01); *H01L 41/0472* (2013.01); *H03B 5/32* (2013.01); *H03H 9/1014* (2013.01);
(Continued)

(58) Field of Classification Search
CPC ............ G04F 5/04; G04F 5/06; G04F 5/063;
H01L 41/00; H01L 41/02; H01L 41/04;
H01L 41/047; H01L 41/0471; H01L 41/0472;
H01L 41/053; H01L 41/08; H01L 41/0805;
H01L 41/083; H01L 41/09; H01L 41/0933;
H01L 41/094; H01L 41/16; H01L 41/18;
H03B 5/30; H03B 5/32; H03H 9/17; H03H
9/19; H03H 9/21; H03H 9/215; H03H
9/2468; H03H 9/2473; H03H 9/2478; H03H
9/2484; H03H 9/2489; H03H 9/2494; H03H
2003/026; H03H 2003/0492
USPC ....... 310/311, 312, 346, 348, 363, 365, 366, 310/370; 331/154, 156, 158, 176
See application file for complete search history.

(56) References Cited

U.S. PATENT DOCUMENTS 5,265,315 A   11/1993   Hoisington et al.
6,407,649 B1 *  6/2002   Tikka et al. .................. 333/133
(Continued)

FOREIGN PATENT DOCUMENTS

JP   H02-32229 U    2/1990
JP   2002-204141 A  7/2002
(Continued)

OTHER PUBLICATIONS

Roszhart; The effect of thermoelastic internal friction on the Q of micromachined silicon resonators; Solid-State Sensor and Actuator Workshop, 4th Technical Digest, IEEE; 1990; pp. 13-16.

*Primary Examiner* — Levi Gannon
(74) *Attorney, Agent, or Firm* — Oliff PLC

(57) ABSTRACT

A vibrator element includes a base portion, a vibrating arm extending from the base portion, a first electrode provided on the vibrating arm, a second electrode provided above the first electrode, a piezoelectric body arranged between the first electrode and the second electrode, and an insulating film arranged between the first electrode and the piezoelectric body, in which the material of the first electrode contains TiN, the material of the insulating film contains $SiO_2$, and the material of the piezoelectric body contains AlN.

7 Claims, 8 Drawing Sheets

(51) Int. Cl.
  *H03H 9/17* (2006.01)
  *H03H 9/21* (2006.01)
  *H03H 9/10* (2006.01)
  *H01L 41/09* (2006.01)

(52) U.S. Cl.
  CPC ............ *H03H 9/21* (2013.01); *H01L 41/0477* (2013.01); *H01L 41/0478* (2013.01); *H01L 41/094* (2013.01)

(56) References Cited

U.S. PATENT DOCUMENTS

| | | | |
|---|---|---|---|
| 8,581,669 B2 * | 11/2013 | Funakawa et al. | 331/156 |
| 2002/0089386 A1 | 7/2002 | Kitamura et al. | |
| 2002/0113527 A1 | 8/2002 | Kawashima | |
| 2003/0234835 A1 * | 12/2003 | Torii et al. | 347/68 |
| 2006/0131680 A1 | 6/2006 | Akiyama et al. | |
| 2007/0228871 A1 * | 10/2007 | Aoki et al. | 310/311 |
| 2008/0105052 A1 * | 5/2008 | Takahashi et al. | 73/504.16 |
| 2008/0143450 A1 * | 6/2008 | Matsumoto et al. | 331/116 R |
| 2008/0169728 A1 * | 7/2008 | Asai et al. | 310/334 |
| 2009/0178260 A1 | 7/2009 | Yamazaki et al. | |
| 2009/0206704 A1 | 8/2009 | Kitamura | |
| 2010/0201223 A1 * | 8/2010 | Ishii et al. | 310/321 |
| 2010/0244973 A1 | 9/2010 | Furuhata et al. | |
| 2010/0244989 A1 | 9/2010 | Furuhata et al. | |
| 2010/0320875 A1 | 12/2010 | Takizawa | |
| 2011/0057549 A1 | 3/2011 | Kawai et al. | |
| 2011/0080070 A1 | 4/2011 | Furuhata et al. | |
| 2011/0134059 A1 | 6/2011 | Paleczny et al. | |
| 2011/0156826 A1 * | 6/2011 | Kawai | 331/116 R |
| 2011/0156827 A1 | 6/2011 | Kawai | |
| 2011/0187470 A1 | 8/2011 | Yamada | |
| 2011/0227661 A1 | 9/2011 | Numata et al. | |
| 2012/0194283 A1 * | 8/2012 | Funakawa et al. | 331/156 |

FOREIGN PATENT DOCUMENTS

| | | |
|---|---|---|
| JP | 2002-261575 A | 9/2002 |
| JP | 2004-260249 A | 9/2004 |
| JP | 2004-265899 A | 9/2004 |
| JP | 2005-151423 A | 6/2005 |
| JP | 2005-318365 A | 11/2005 |
| JP | 2008-011348 A | 1/2008 |
| JP | 2009-005022 A | 1/2009 |
| JP | 2009-005023 A | 1/2009 |
| JP | 2009-005024 A | 1/2009 |
| JP | 2009-043889 A | 2/2009 |
| JP | 2009-118217 A | 5/2009 |
| JP | 2009-171118 A | 7/2009 |
| JP | 2009-200706 A | 9/2009 |
| JP | 2009-239860 A | 10/2009 |
| JP | 2010-028535 A | 2/2010 |
| JP | 2010-028536 A | 2/2010 |
| JP | 2010-081156 A | 4/2010 |
| JP | 2010-103805 A | 5/2010 |
| JP | 2010-187059 A | 8/2010 |
| JP | 2010-187195 A | 8/2010 |
| JP | 2010-187196 A | 8/2010 |
| JP | 2010-187197 A | 8/2010 |
| JP | 2010-193331 A | 9/2010 |
| JP | 2010-226608 A | 10/2010 |
| JP | 2010-226609 A | 10/2010 |
| JP | 2010-252302 A | 11/2010 |
| JP | 2010-252303 A | 11/2010 |
| JP | 2011-004035 A | 1/2011 |
| JP | 2011-082782 A | 4/2011 |
| JP | 2011-082945 A | 4/2011 |
| JP | 2011-087154 A | 4/2011 |
| JP | 2011-096706 A | 5/2011 |
| JP | 2011-097562 A | 5/2011 |
| JP | 2011-155628 A | 8/2011 |
| JP | 2011-155629 A | 8/2011 |
| JP | 2011-160250 A | 8/2011 |
| JP | 2011-199453 A | 10/2011 |
| JP | 2011-199454 A | 10/2011 |
| JP | 2011-199661 A | 10/2011 |
| JP | 2011-223371 A | 11/2011 |
| JP | 2011-223435 A | 11/2011 |
| JP | 2011-223489 A | 11/2011 |
| JP | 2011-228980 A | 11/2011 |
| JP | 2011-232264 A | 11/2011 |
| JP | 2011-234072 A | 11/2011 |
| JP | A-2011-228922 | 11/2011 |
| WO | 00/44092 A1 | 7/2000 |

* cited by examiner

VIBRATOR ELEMENT, VIBRATOR, OSCILLATOR, ELECTRONIC APPARATUS, AND MOVING OBJECT

BACKGROUND

1. Technical Field

The present invention relates to a vibrator element, and a vibrator, an oscillator, an electronic apparatus, and a moving object including the vibrator element.

2. Related Art

As a vibrator element in the related art, a vibrator element including a base portion, an arm extending from the base portion, and a piezoelectric element arranged on a main surface of the arm has been known. In the vibrator element, the piezoelectric element includes a piezoelectric body layer, a first electrode layer provided on the main surface side of the piezoelectric body layer, and a second electrode layer provided on the side opposite to the main surface of the piezoelectric body layer; the first electrode layer includes an electrode layer arranged on the main surface side and a nitride layer arranged on the piezoelectric body layer side where the electrode layer and the nitride layer are stacked on each other; and the nitride layer is a nitride of an electrode material forming the electrode layer of the first electrode layer (for example, refer to JP-A-2011-228922).

In an embodiment of the vibrator element, Ti (titanium) is used for the electrode layer of the first electrode layer, while TiN (titanium nitride) is used for the nitride layer of the first electrode layer.

According to JP-A-2011-228922, in the vibrator element, the orientation of the piezoelectric body layer (AlN: aluminum nitride) formed on the nitride layer is improved by the nitride layer using TiN, and at the same time, a reduction in an effective electric field is suppressed, so that the arm can be efficiently vibrated.

However, the evaluation test performed by the present inventors of the invention has revealed that the vibrator element has room for improvement in the orientation (C-axis orientation) of the piezoelectric body layer (details will be described later).

SUMMARY

An advantage of some aspects of the invention is to solve at least a part of the problems described above, and the invention can be implemented as the following forms or application examples.

APPLICATION EXAMPLE 1

A vibrator element according to this application example includes: a base portion; a vibrating arm extending from the base portion; a first electrode containing TiN and arranged on the vibrating arm; a second electrode arranged above the first electrode; a piezoelectric body containing AlN and arranged between the first electrode and the second electrode; and an insulating film containing $SiO_2$ and arranged between the first electrode and the piezoelectric body.

According to the application example, the vibrator element includes the first electrode (corresponding to the first electrode layer) provided on the vibrating arm (corresponding to the arm), the second electrode (corresponding to the second electrode layer) provided above the first electrode, the piezoelectric body (corresponding to the piezoelectric body layer) arranged between the first electrode and the second electrode, and the insulating film arranged between the first electrode and the piezoelectric body.

In the vibrator element, the material of the first electrode contains TiN, the material of the insulating film contains $SiO_2$ (silicon dioxide), and the material of the piezoelectric body contains AlN.

With this configuration, since the material of the first electrode contains TiN, the vibration characteristics of the vibrator element become favorable due to the characteristics (the Q value is less likely to be degraded) of TiN.

Moreover, since the material of the piezoelectric body contains AlN, the vibrator element has excellent elasticity at the time of application of an electric field due to the high orientation of AlN, and therefore, the vibrating arm can be efficiently vibrated.

Moreover, in the vibrator element, the insulating film containing $SiO_2$ in an amorphous form, for example, is thinned and planarized to be arranged on the first electrode that is thinned and planarized (smoothed) due to TiN being contained. With this configuration, the piezoelectric body containing AlN and arranged on the planarized insulating film can also be planarized in the vibrator element.

As a result, in the vibrator element, the insulating film containing $SiO_2$ and covering the first electrode functions as a crystal orientation control film, the adverse effect of the first electrode on the orientation of the piezoelectric body can be suppressed, and the direction of crystal of the piezoelectric body arranged (formed) on the insulating film is aligned. Therefore, the orientation of the piezoelectric body can be further improved.

These advantages are based on the findings obtained by the present inventors from a result of analysis or the like through an experiment.

With the configuration described above, the vibrator element can efficiently vibrate, so that excellent vibration characteristics can be obtained.

APPLICATION EXAMPLE 2

In the vibrator element according to the application example described above, it is preferable that the material of the second electrode contains TiN.

According to this application example, in the vibrator element, the material of the second electrode contains TiN, which is the same material as that of the first electrode, and therefore, compared to the case where the second electrode contains another material, the vibrator element can be easily manufactured, so that the productivity can be improved.

In addition, in the vibrator element, the material of the second electrode contains TiN, and therefore, compared to the case where the second electrode contains another material, the Q value can be less likely to be degraded due to the characteristics of TiN.

APPLICATION EXAMPLE 3

In the vibrator element according to the application example described above, it is preferable that the base portion and the vibrating arm contain Si.

According to this application example, since the base portion and the vibrating arm contain Si in the vibrator element, performance potential with regard to the Q value (for example, the Q value in the base portion and the vibrating arm) can be higher than, for example, quartz crystal due to the characteristics of Si.

APPLICATION EXAMPLE 4

In the vibrator element according to Application Example 3, it is preferable that a film containing $SiO_2$ is arranged between the vibrating arm and the first electrode, or on a surface of the vibrating arm on the side opposite to the first electrode side.

According to this application example, the film containing $SiO_2$ is provided between the vibrating arm and the first electrode, or on the surface of the vibrating arm on the side opposite to the first electrode side in the vibrator element. Therefore, the frequency-temperature characteristic of the vibrating arm whose base material is Si is corrected by the frequency-temperature characteristic of the film containing $SiO_2$, and it is possible to suppress fluctuations in frequency due to temperature changes, so that the frequency-temperature characteristic can be improved.

APPLICATION EXAMPLE 5

A vibrator according to this application example includes: the vibrator element according to any of the application examples; and a package accommodating the vibrator element.

According to this application example, the vibrator having the configuration includes the vibrator element according to any of the application examples and the package accommodating the vibrator element. Therefore, it is possible to provide the vibrator producing the advantageous effect according to any of the application examples.

APPLICATION EXAMPLE 6

An oscillator according to this application example includes: the vibrator element according to any of the application examples; and an oscillation circuit causing the vibrator element to oscillate.

According to this application example, the oscillator having the configuration includes the vibrator element according to any of the application examples and the oscillation circuit causing the vibrator element to oscillate. Therefore, it is possible to provide the oscillator producing the advantageous effect according to any of the application examples.

APPLICATION EXAMPLE 7

An electronic apparatus according to this application example includes the vibrator element according to any of the application examples.

According to this application example, the electronic apparatus having the configuration includes the vibrator element according to any of the application examples. Therefore, it is possible to provide the electronic apparatus producing the advantageous effect according to any of the application examples.

APPLICATION EXAMPLE 8

A moving object according to this application example includes the vibrator element according to any of the application examples.

According to this application example, the moving object having the configuration includes the vibrator element according to any of the application examples. Therefore, it is possible to provide the moving object producing the advantageous effect according to any of the application examples.

BRIEF DESCRIPTION OF THE DRAWINGS

The invention will be described with reference to the accompanying drawings, wherein like numbers reference like elements.

FIGS. 1A and 1B are schematic views showing a schematic configuration of a vibrator element of a first embodiment, in which FIG. 1A is a plan view; and FIG. 1B is a cross-sectional view taken along the line A-A in FIG. 1A.

FIGS. 3A and 3B are graphs each showing a result of examination of the C-axis orientation of a piezoelectric body using an X-ray diffractometer, in which FIG. 3A is a graph showing a result of examination of a sample of the first embodiment; and FIG. 3B is a graph showing a result of examination of a sample having a related-art configuration.

FIGS. 5A and 5B are schematic views showing a schematic configuration of a vibrator element of a modified example of the first embodiment, in which FIG. 5A is a plan view; and FIG. 5B is a cross-sectional view taken along the line A-A in FIG. 5A.

FIGS. 6A and 6B are schematic views showing a schematic configuration of a vibrator element of a second embodiment, in which FIG. 6A is an overhead plan view from a lid side; and FIG. 6B is a cross-sectional view taken along the line C-C in FIG. 6A.

FIGS. 7A and 7B are schematic views showing a schematic configuration of an oscillator of a third embodiment, in which FIG. 7A is an overhead plan view from the lid side; and FIG. 7B is a cross-sectional view taken along the line C-C in FIG. 7A.

DESCRIPTION OF EXEMPLARY EMBODIMENTS

Hereinafter, embodiments in which the invention is embodied will be described with reference to the drawings.
First Embodiment Herein, a vibrator element using Si (silicon) for a base material will be described as an example of a vibrator element.

Figure 1A:
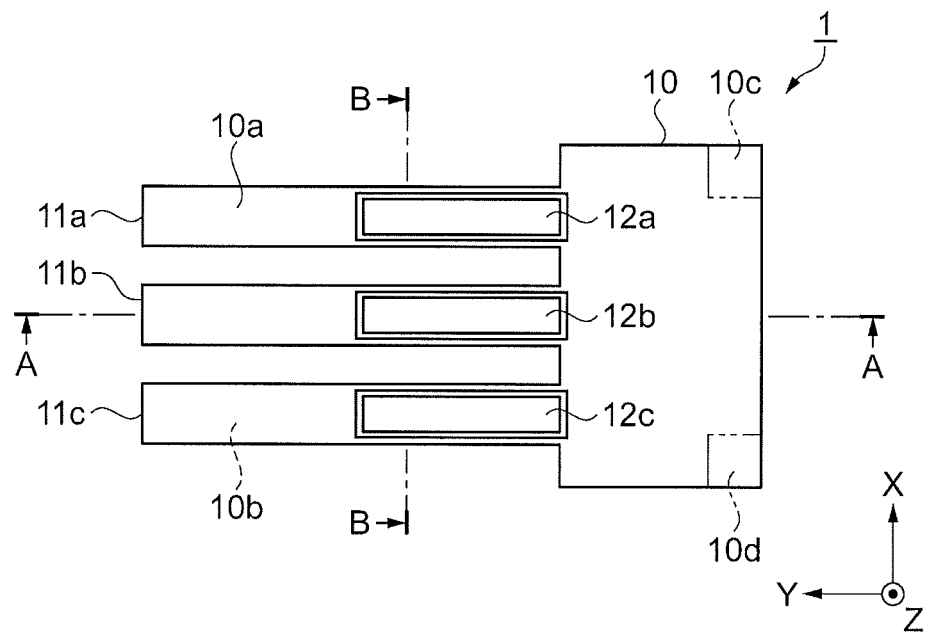
Figure 1B:
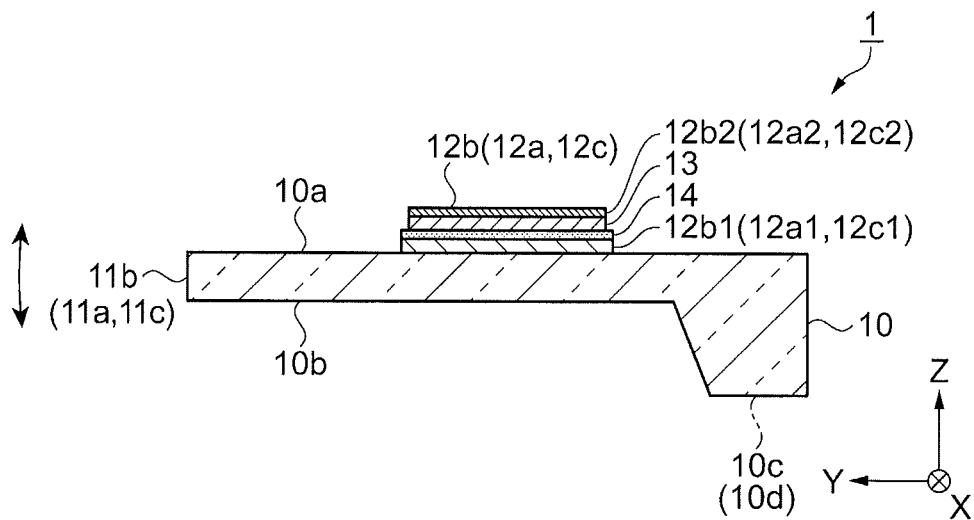

FIGS. 1A and 1B are schematic views showing a schematic configuration of a vibrator element of a first embodiment. FIG. 1A is a plan view; and FIG. 1B is a cross-sectional view taken along the line A-A in FIG. 1A. Wiring is omitted, and the ratios of dimensions of components are different from the actual ones.

Figure 2:
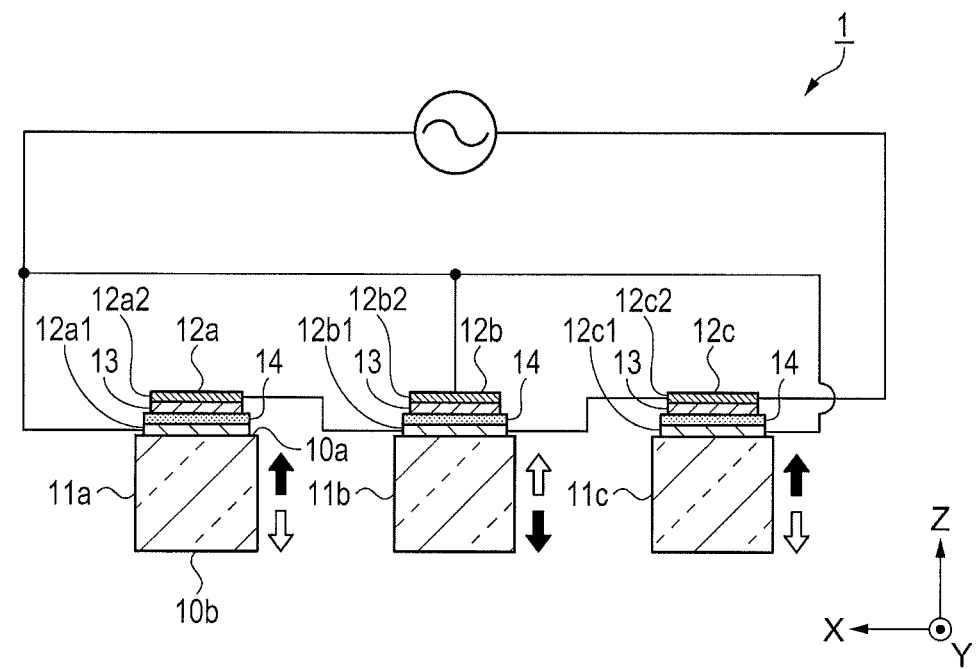
FIG. 2 is a cross-sectional view taken along the line B-B in FIG. 1A and is a wiring diagram of excitation electrodes.

FIG. 2 is a cross-sectional view taken along the line B-B in FIG. 1A and is a wiring diagram of excitation electrodes.

An X-axis, a Y-axis, and a Z-axis in each of the drawings are coordinate axes orthogonal to each other.

As shown in FIGS. 1A and 1B, the vibrator element 1 includes, as a base material, a base portion 10 and three vibrating arms 11a, 11b, and 11c extending in a Y-axis direction from the base portion 10. In the embodiment, a Si substrate (for example, an SOI substrate or a substrate on which Poly-Si is deposited) is used for the three vibrating arms 11a, 11b, and 11c and the base portion 10.

The vibrating arms 11a, 11b, and 11c are formed in a substantially square column shape, arrayed in an X-axis direction orthogonal to the Y-axis direction in a plan view, and provided with excitation electrodes 12a, 12b, and 12c on at least one (main surface 10a herein) of main surfaces 10a and 10b along a plane (XY plane) specified by the X-axis and the Y-axis.

The vibrating arms 11a, 11b, and 11c perform flexural vibration (out-of-plane vibration: vibration in a direction not along the main surface 10a) with the excitation electrodes 12a, 12b, and 12c in a Z-axis direction (direction of the arrow in FIG. 1B) orthogonal to the main surface 10a.

The base portion 10 and the vibrating arms 11a, 11b, and 11c, and the excitation electrodes 12a, 12b, and 12c are accurately formed using, for example, a sputtering technique, a photolithographic technique, an etching technique, or the like.

The excitation electrodes 12a, 12b, and 12c have stacked structures including first electrodes 12a1, 12b1, and 12c1 provided on the main surface 10a side, second electrodes 12a2, 12b2, and 12c2 provided above the first electrodes 12a1, 12b1, and 12c1, a piezoelectric body 13 arranged between the first electrodes 12a1, 12b1, and 12c1 and the second electrodes 12a2, 12b2, and 12c2, and an insulating film 14 arranged between the first electrodes 12a1, 12b1, and 12c1 and the piezoelectric body 13.

For the first electrodes 12a1, 12b1, and 12c1 and the second electrodes 12a2, 12b2, and 12c2 of the excitation electrodes 12a, 12b, and 12c, a film containing TiN (titanium nitride) is used. For the piezoelectric body 13, a film containing AlN (aluminum nitride) is used. For the insulating film 14, a film containing $SiO_2$ (silicon dioxide) in an amorphous state is used.

In view of obtaining favorable vibration characteristics in the vibrator element 1, the thickness of the first electrodes 12a1, 12b1, and 12c1 and the second electrodes 12a2, 12b2, and 12c2 of the excitation electrodes 12a, 12b, and 12c is preferably about 15 nm, the thickness of the piezoelectric body 13 is preferably from about 200 nm to 400 nm, and the thickness of the insulating film 14 is preferably about 10 nm.

For the second electrodes 12a2, 12b2, and 12c2, a film containing another material (for example, Mo, Ti, Ni, Pt, Au, W, WSi, Ta, ITO, or the like) different from TiN may be used.

It is preferable, in view of obtaining efficient vibration characteristics, that the excitation electrodes 12a, 12b, and 12c extend from the base (boundary portion with the base portion 10) of the vibrating arms 11a, 11b, and 11c toward the tip thereof and are provided in a length about one-half the entire length (length from the base to the tip in the Y-axis direction) of the vibrating arms 11a, 11b, and 11c.

As shown in FIG. 1B, the thickness of the base portion 10 in the Z-axis direction is greater than the thickness of the vibrating arms 11a, 11b, and 11c in the Z-axis direction.

Moreover, as shown by the two-dot chain line in FIG. 1A, fixing portions 10c and 10d as fixing areas to an external member such as a package are provided on the main surface 10b side at both edge portions of the base portion 10 in the X-axis direction. The fixing portions 10c and 10d are preferably provided at edge portions of the base portion 10 on the side opposite to the vibrating arms 11a, 11b, and 11c side in the Y-axis direction.

Here, the operation of the vibrator element 1 will be described.

As shown in FIG. 2, in the excitation electrodes 12a, 12b, and 12c of the vibrator element 1, the first electrodes 12a1, 12b1, and 12c1 and the second electrodes 12a2, 12b2, and 12c2 are connected by cross-wiring to an AC power supply, so that an alternating voltage as a drive voltage is applied.

Specifically, the first electrode 12a1 of the vibrating arm 11a, the second electrode 12b2 of the vibrating arm 11b, and the first electrode 12c1 of the vibrating arm 11c are connected to one another so as to have the same potential, and the second electrode 12a2 of the vibrating arm 11a, the first electrode 12b1 of the vibrating arm 11b, and the second electrode 12c2 of the vibrating arm 11c are connected to one another so as to have the same potential.

In this state, when an alternating voltage is applied between the first electrodes 12a1, 12b1, and 12c1 and the second electrodes 12a2, 12b2, and 12c2, electric fields are generated between the first electrodes 12a1, 12b1, and 12c1 and the second electrodes 12a2, 12b2, and 12c2. With an inverse piezoelectric effect, distortion is generated in the piezoelectric body 13, so that the piezoelectric body 13 expands and contracts in the Y-axis direction.

The vibrator element 1 is configured such that the direction of an electric field generated in the excitation electrodes 12a and 12c and the direction of an electric field generated in the excitation electrode 12b are opposite from each other due to the cross-wiring, and that the piezoelectric body 13 expands and contracts in an opposite manner between the vibrating arms 11a and 11c and the vibrating arm 11b.

Specifically, when the piezoelectric body 13 of the vibrating arms 11a and 11c expands, the piezoelectric body 13 of the vibrating arm 11b contracts; while when the piezoelectric body 13 of the vibrating arms 11a and 11c contracts, the piezoelectric body 13 of the vibrating arm 11b expands.

With the expansion and contraction of the piezoelectric body 13 described above in the vibrator element 1, the vibrating arms 11a, 11b, and 11c bend toward the directions of the black arrows when an alternating voltage is at one potential; while the vibrating arms 11a, 11b, and 11c bend toward the directions of the open arrows when the alternating voltage is at the other potential.

By repeating this bending in the vibrator element 1, the vibrating arms 11a, 11b, and 11c perform flexural vibration (out-of-plane vibration) in the Z-axis direction. In this case, vibrating arms next to each other (11a and 11b, and 11b and 11c herein) perform flexural vibration in opposite directions (in phase opposition).

The more favorable the C-axis orientation at the time of polarization is, the higher the degree of expansion and contraction of the piezoelectric body 13 is.

In the vibrator element 1 of the embodiment as described above, the material of the first electrodes 12a1, 12b1, and 12c1 of the excitation electrodes 12a, 12b, and 12c provided on the vibrating arms 11a, 11b, and 11c contains TiN, the material of the insulating film 14 contains $SiO_2$, and the material of the piezoelectric body 13 contains AlN.

With this configuration, since the material of the first electrodes 12a1, 12b1, and 12c1 contains TiN, vibration characteristics of the vibrator element 1 become favorable due to the characteristics (Q value is less likely to be degraded) of TiN.

Moreover, since the material of the piezoelectric body 13 contains AlN, the vibrator element 1 has excellent elasticity at the time of application of an electric field due to the high orientation of AlN, and therefore, the vibrating arms 11a, 11b, and 11c can be efficiently vibrated.

Moreover, in the vibrator element 1, the insulating film 14 containing $SiO_2$ in an amorphous form is thinned and planarized to be arranged on the first electrodes 12a1, 12b1, and 12c1 that are thinned and planarized (smoothed) due to TiN being contained.

With this configuration, the piezoelectric body containing AlN and arranged on the planarized insulating film 14 can also be planarized in the vibrator element 1.

As a result, in the vibrator element 1, the insulating film 14 containing $SiO_2$ and covering the first electrodes 12a1, 12b1, and 12c1 functions as a crystal orientation control film, the adverse effect of the first electrodes 12a1, 12b1, and 12c1 on the orientation of the piezoelectric body 13 can be suppressed, and the direction of crystal of the piezoelectric body 13 arranged (formed) on the insulating film 14 is aligned. Therefore, the orientation of the piezoelectric body 13 can be further improved.

These facts are based on the findings obtained by the present inventors from a result of analysis or the like through an experiment.

The above will be described with reference to the drawings.

Figure 3A:
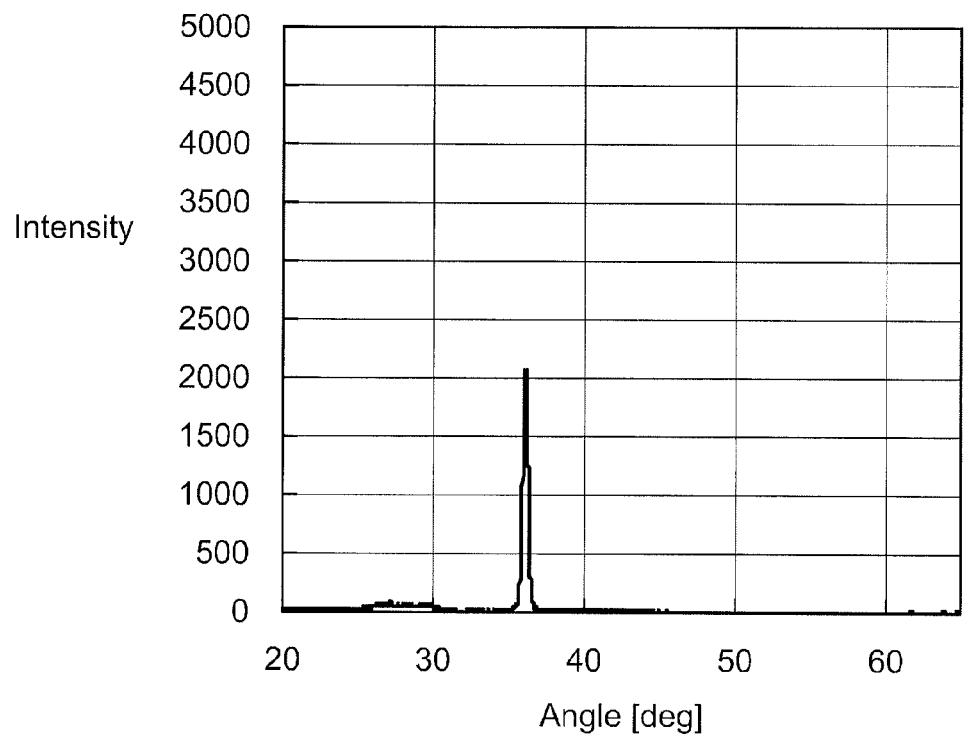
Figure 3B:
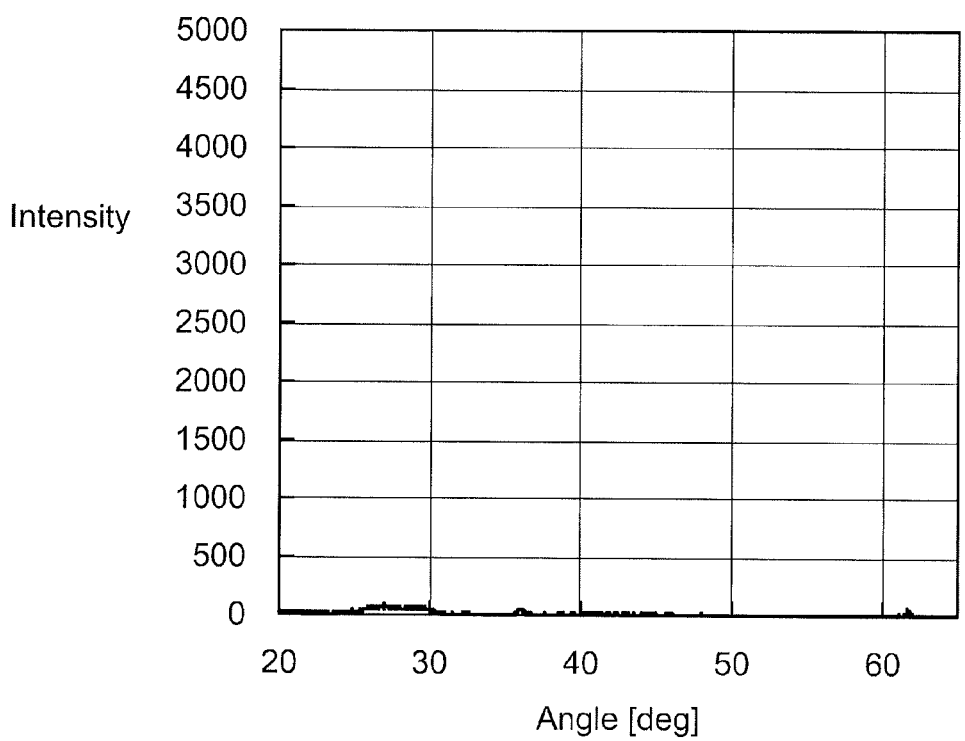
Figure 4:
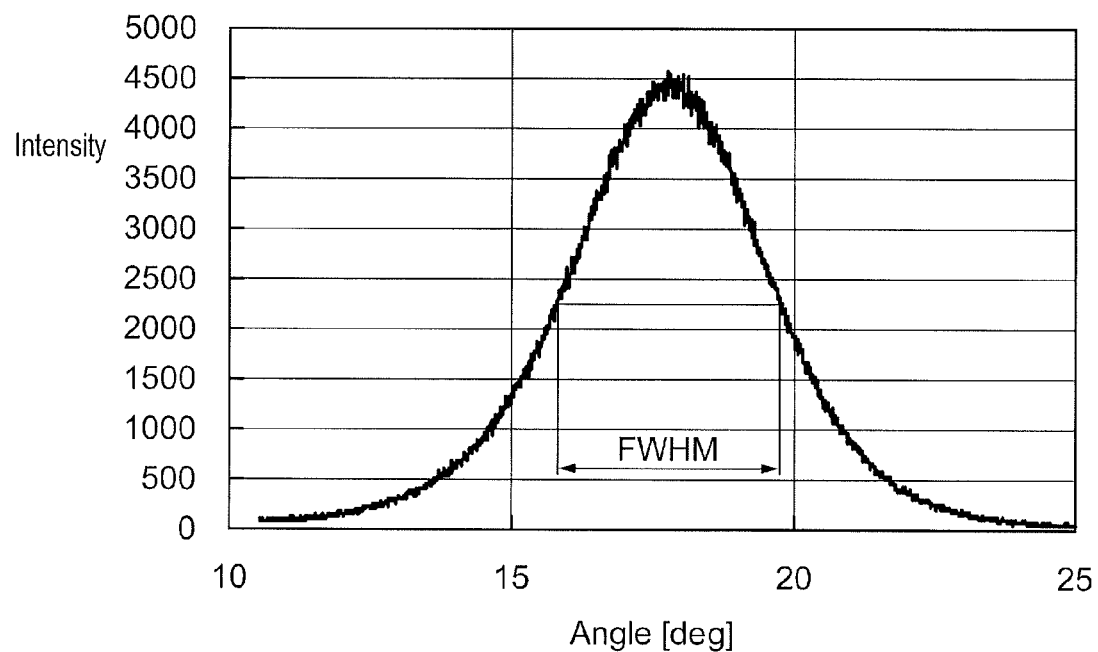
FIG. 4 is another graph showing a result of examination of the C-axis orientation of the piezoelectric body of the sample of the first embodiment using an X-ray diffractometer.

FIGS. 3A to 4 are graphs each showing a result of examination of the C-axis orientation of a piezoelectric body using an X-ray diffractometer. FIGS. 3A and 4 are graphs each showing a result of examination of a sample of the embodiment. FIG. 3B is a graph showing a result of examination of a sample having a related-art configuration (JP-A-2011-228922).

The horizontal axis of the graphs represents the angle of X-rays to the samples, while the vertical axis represents the intensity of X-rays reflected from the samples.

Since the piezoelectric body is directly irradiated with X-rays, the second electrode is removed from the samples.

The surface roughness of the piezoelectric body of the sample of the embodiment in this state was Ra=0.39 nm, which was favorable.

As shown in FIG. 3A, the sample of the embodiment has a distinct peak (peak of diffraction intensity) appearing on the graph in a θ-2θ measurement method in X-ray diffraction, with an angle (diffraction angle) of 36 degrees (2θ) at the time of the peak. In addition, as shown in FIG. 4, since the half-width (FWHM) of the peak in the sample of the embodiment is 3.966 degrees in a ω measurement method in X-ray diffraction, it has been confirmed that the C-axis orientation is favorable.

On the other hand, as shown in FIG. 3B, the sample having the related-art configuration has indistinct peaks on the graph in the θ-2θ measurement method, resulting in an unfavorable C-axis orientation.

In the vibrator element 1 as described above, since the C-axis orientation of the piezoelectric body 13 is favorable, the elasticity is excellent at the time of application of an electric field, efficient vibration with the excitation electrodes 12a, 12b, and 12c is possible, and excellent vibration characteristics can be obtained.

The θ-2θ measurement method in an X-ray diffractometer is a method of performing scanning while moving a detector portion by 2θ when an X-ray source is fixed and only a sample stage is moved by θ. The ω measurement method is a method of performing scanning only on the sample stage in the vicinity of a Bragg reflection angle (in the vicinity of 18 degrees herein) by fixing the X-ray source and the detector portion.

Moreover, in the vibrator element 1, the material of the second electrodes 12a2, 12b2, and 12c2 contains TiN, which is the same material as that of the first electrode, and therefore, compared to the case where the second electrodes 12a2, 12b2, and 12c2 contain another material, the vibrator element 1 can be easily manufactured, so that the productivity can be improved.

In addition, in the vibrator element 1, the material of the second electrodes 12a2, 12b2, and 12c2 contains TiN, and therefore, compared to the case where the second electrodes 12a2, 12b2, and 12c2 contain another material, the Q value can be less likely to be degraded due to the characteristics of TiN.

Moreover, in the vibrator element 1, since the base material contains Si, performance potential with regard to the Q value (for example, the Q value in the base material alone) can be higher than, for example, quartz crystal due to the characteristics of Si (for example, the Q value in the base material alone can be increased to about 10 times that of quartz crystal).

In the vibrator element 1, the base material may contain quartz crystal instead of Si. According to this configuration, the vibrator element 1 can obtain an advantageous effect equivalent to the case where the base material contains Si, with regard to the C-axis orientation of the piezoelectric body 13.

For the base material of the vibrator element 1, other materials than Si or quartz crystal, which have the Q value compatible to that of Si or quartz crystal, may be used.

MODIFIED EXAMPLE

Here, a modified example of the first embodiment will be described.

Figure 5A:
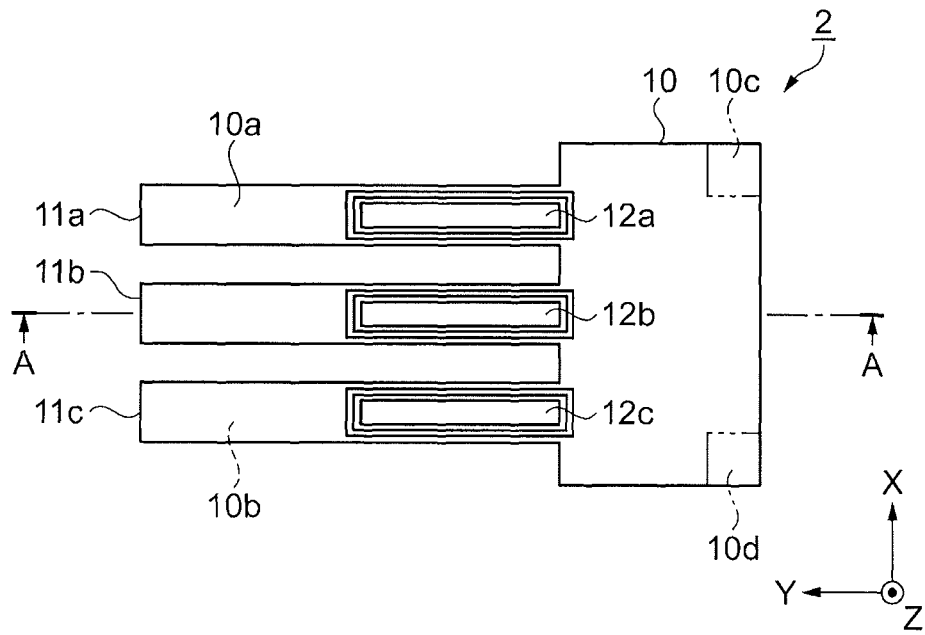
Figure 5B:
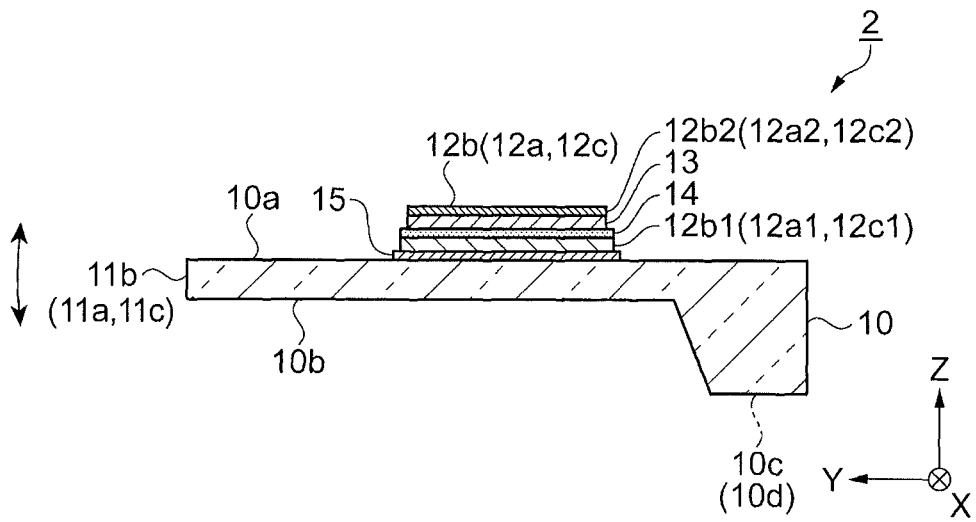

FIGS. 5A and 5B are schematic views showing a schematic configuration of a vibrator element of the modified example of the first embodiment. FIG. 5A is a plan view; and FIG. 5B is a cross-sectional view taken along the line A-A in FIG. 5A. Portions common to the first embodiment and the modified example are denoted by the same reference numerals and signs, and a detailed description is omitted. Portions of the modified example different from the first embodiment will be mainly described.

As shown in FIGS. 5A and 5B, the vibrator element 2 of the modified example is different in configurations around the excitation electrodes 12a, 12b, and 12c compared to the first embodiment.

The vibrator element 2 is provided with a film containing $SiO_2$ between the main surface 10a of the vibrating arms 11a, 11b, and 11c and the first electrodes 12a1, 12b1, and 12c1 of the excitation electrodes 12a, 12b, and 12c.

The film 15 containing $SiO_2$ is accurately formed using, for example, a sputtering technique, a photolithographic technique, an etching technique, or the like. The thickness of the film 15 is preferably from about 100 nm to 300 nm.

According to this configuration, since the vibrator element 2 is provided with the film 15 containing $SiO_2$ between the main surface 10a of the vibrating arms 11a, 11b, and 11c and the first electrodes 12a1, 12b1, and 12c1, the film 15 containing $SiO_2$ functions as a temperature characteristic correction film of the vibrating arms 11a, 11b, and 11c.

Specifically, the gradient of the frequency-temperature characteristic of the vibrating arms 11a, 11b, and 11c whose base material is Si is corrected (compensated) by the gradient of the frequency-temperature characteristic of the film 15 containing $SiO_2$, so that the vibrator element 2 has a flat frequency-temperature characteristic.

With this configuration, it is possible in the vibrator element 2 to suppress fluctuations in frequency due to temperature changes, so that the frequency-temperature characteristic can be improved.

In the vibrator element 2, the film 15 containing $SiO_2$ may be provided on the surface (the main surface 10b) of the vibrating arms 11a, 11b, and 11c on the side opposite to the first electrodes 12a1, 12b1, and 12c1 side (the main surface 10a side).

According to this configuration, the vibrator element 2 can obtain an advantageous effect similar to the above.

Second Embodiment

Next, a vibrator including the vibrator element described in the first embodiment (including the modified example, hereinafter the same) will be described.

Figure 6A:
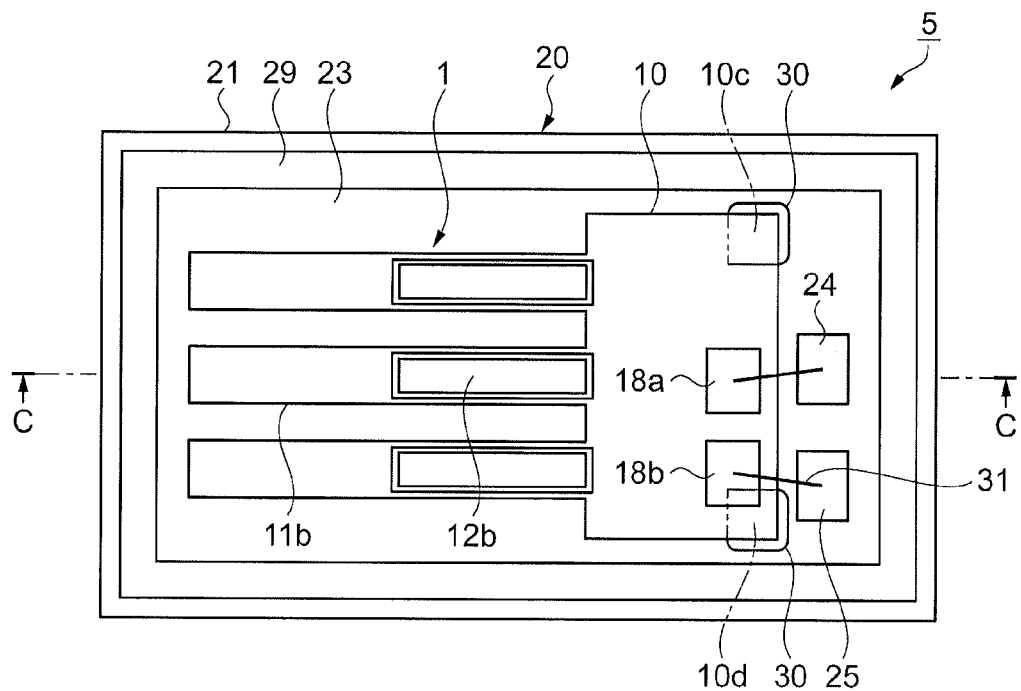
Figure 6B:
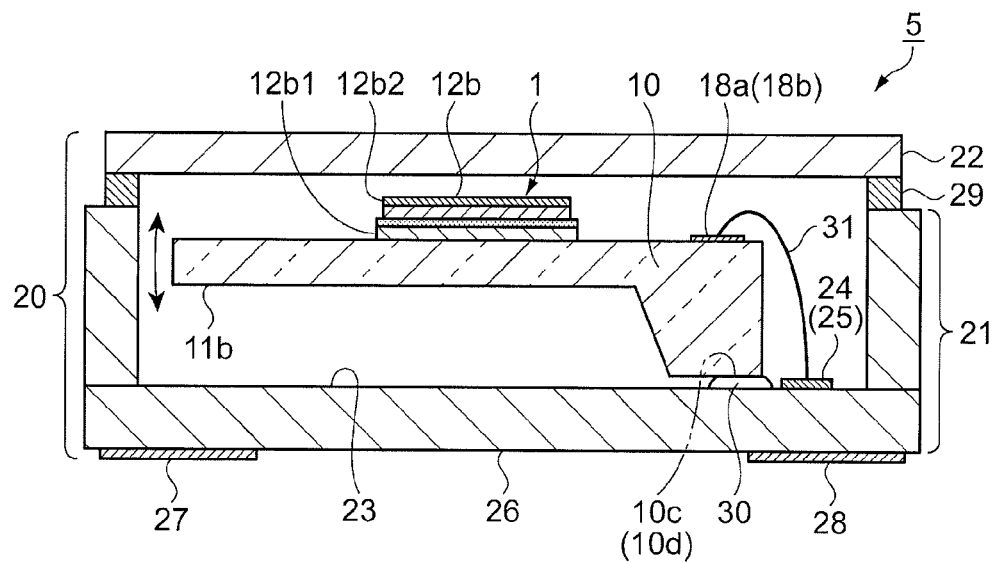

FIGS. 6A and 6B are schematic views showing a schematic configuration of a vibrator of a second embodiment. FIG. 6A is an overhead plan view from a lid side; and FIG. 6B is a cross-sectional view taken along the line C-C in FIG. 6A. In the plan view, the lid is omitted. Moreover, wiring is omitted.

Portions common to the first and second embodiments are denoted by the same reference numerals and signs, and a detailed description is omitted. Portions of the second embodiment different from the first embodiment will be mainly described.

As shown in FIGS. 6A and 6B, the vibrator 5 includes any of the vibrator element 1 and the vibrator element 2 (the vibrator element 1 herein) described in the first embodiment and a package 20 accommodating the vibrator element 1.

The package 20 includes a package base 21 and a flat plate-like lid 22, and is formed in a substantially rectangular parallelepiped shape. The package base 21 is substantially rectangular in planar shape and has a recess. The lid 22 covers the recess of the package base 21 and is substantially rectangular in planar shape.

For the package base 21, an aluminum oxide-based sintered body obtained by molding, stacking, and baking a ceramic green sheet, quartz crystal, glass, Si, or the like is used.

For the lid 22, the same material as that of the package base 21, or metal such as Kovar or 42 Alloy is used.

The package base 21 is provided with internal terminals 24 and 25 on an inner bottom surface (bottom surface inside the recess) 23.

The internal terminals 24 and 25 are formed in a substantially rectangular shape at positions near connection electrodes 18a and 18b provided on the base portion 10 of the vibrator element 1. The connection electrodes 18a and 18b are connected by wiring (not shown) to the first electrodes (12b1 and the like) and the second electrodes (12b2 and the like) of the excitation electrodes (12b and the like) of the vibrator element 1.

For example, in the wiring in FIG. 2, the wiring on one side of the AC power supply is connected to the connection electrode 18a, while the wiring on the other side is connected to the connection electrode 18b.

On an outer bottom surface (surface on the side opposite to the inner bottom surface 23, that is, an outside bottom surface) 26 of the package base 21, a pair of external terminals 27 and 28 used when the package is mounted on an external member such as an electronic apparatus are formed.

The external terminals 27 and 28 are connected by internal wiring (not shown) to the internal terminals 24 and 25. For example, the external terminal 27 is connected to the internal terminal 24, while the external terminal 28 is connected to the internal terminal 25.

The internal terminals 24 and 25 and the external terminals 27 and 28 are formed of a metal film obtained by stacking coated films made of Ni, Au, and the like on a metallization layer made of W, Mo, or the like by a method such as plating.

In the vibrator 5, the fixing portions 10c and 10d of the base portion 10 of the vibrator element 1 are fixed to the inner bottom surface 23 of the package base 21 via an adhesive 30 such as an epoxy-based, silicone-based, or polyimide-based adhesive.

In the vibrator 5, the connection electrodes 18a and 18b of the vibrator element 1 are connected to the internal terminals 24 and 25 by metal wires 31 made of Au, Al, or the like.

In the vibrator 5, in a state where the vibrator element 1 is connected to the internal terminals 24 and 25 of the package base 21, the recess of the package base 21 is covered with the lid 22, and the package base 21 and the lid 22 are bonded together with a bonding member 29 such as a seam ring, a low-melting-point glass, or an adhesive, so that the interior of the package 20 is airtightly sealed.

The interior of the package 20 is in a reduced-pressure state (state with a high degree of vacuum) or a state filled with an inert gas such as nitrogen, helium, or argon.

The package may be composed of a plate-like package base, a lid having a recess, and the like. Moreover, the package may include a recess in both a package base and a lid.

The base portion 10 of the vibrator element 1 may be fixed at a portion other than the fixing portions 10c and 10d, for example, at one place of a portion including the center of a line connecting the fixing portion 10c with the fixing portion 10d, instead of the fixing portions 10c and 10d.

According to this configuration, since the vibrator element 1 is fixed at one place, the distortion of the base portion 10 due to a thermal stress caused in the fixing portion can be suppressed.

In the vibrator 5, with a drive signal (alternating voltage) applied to the excitation electrodes (12b and the like) via the external terminals 27 and 28, the internal terminals 24 and 25, the metal wires 31, and the connection electrodes 18a and 18b, the vibrating arms (1ib and the like) of the vibrator element 1 oscillate (resonate) in the thickness direction (direction of the arrow in FIG. 6B) at a predetermined frequency (about 32.768 kHz as an example).

As described above, since the vibrator 5 of the second embodiment includes the vibrator element 1, it is possible to provide the vibrator producing the advantageous effect described in the first embodiment.

Also when the vibrator 5 includes the vibrator element 2 of the modified example instead of the vibrator element 1, it is possible to provide a vibrator producing an advantageous effect similar to the above and the advantageous effect specific to the vibrator element 2.

Third Embodiment

Next, an oscillator including the vibrator element described in the first embodiment will be described.

Figure 7A:
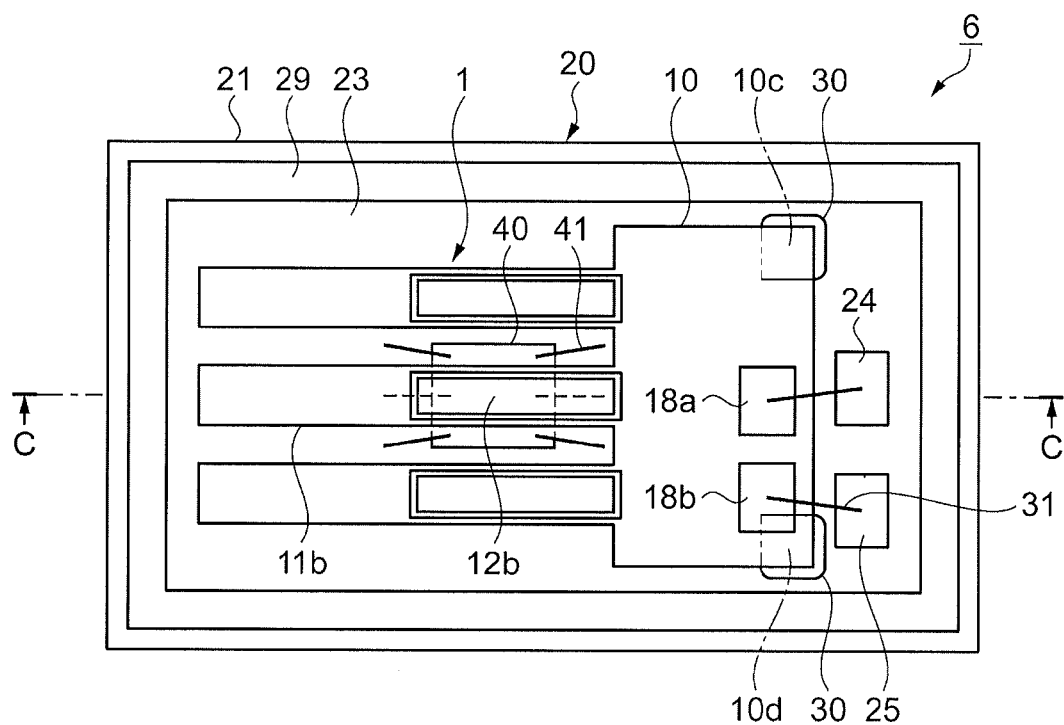
Figure 7B:
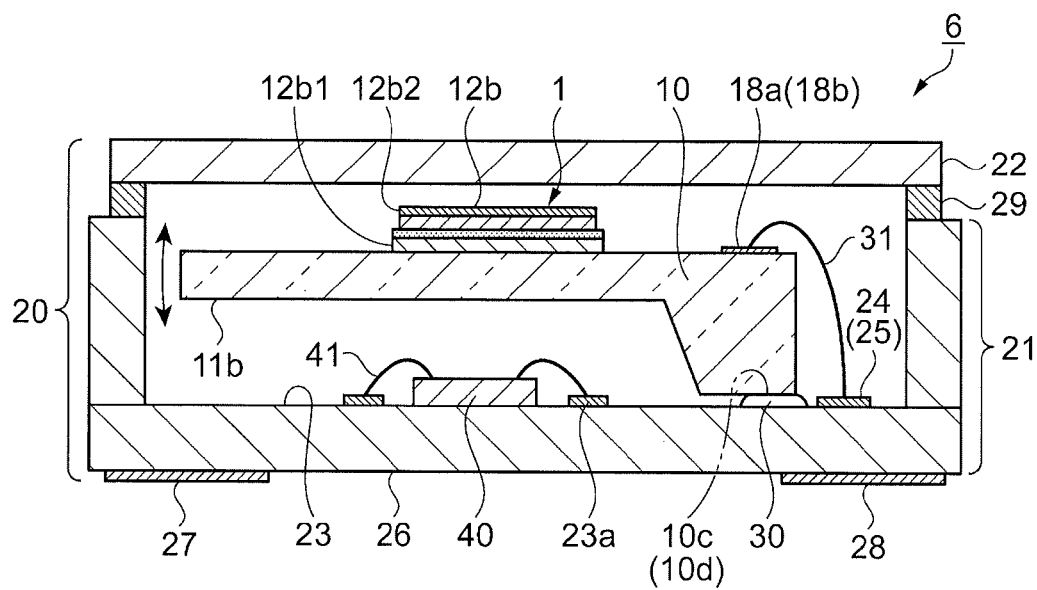

FIGS. 7A and 7B are schematic views showing a schematic configuration of an oscillator of a third embodiment. FIG. 7A is an overhead plan view from the lid side; and FIG. 7B is a cross-sectional view taken along the line C-C in FIG. 7A. In the plan view, the lid and some components are omitted. Moreover, wiring is omitted.

Portions common to the first, second, and third embodiments are denoted by the same reference numerals and signs, and a detailed description is omitted. Portions of the third embodiment different from the first and second embodiments will be mainly described.

As shown in FIGS. 7A and 7B, the oscillator 6 includes any of the vibrator element 1 and the vibrator element 2 (the vibrator element 1 herein) described in the first embodiment, an IC chip 40 as an oscillation circuit causing the vibrator element 1 to oscillate, and the package 20 accommodating the vibrator element 1 and the IC chip 40.

On the inner bottom surface 23 of the package base 21, internal connection terminals 23a are provided.

The IC chip 40 incorporating the oscillation circuit is fixed to the inner bottom surface 23 of the package base 21 using an adhesive (not shown) or the like.

The IC chip 40 has connection pads (not shown) connected to the internal connection terminals 23a by metal wires 41 made of Au, Al, or the like.

The internal connection terminals 23a are formed of a metal film obtained by stacking coated films made of Ni, Au, and the like on a metallization layer made of W, Mo, or the like by plating or the like. The internal connection terminals 23a are connected via internal wiring (not shown) to the external terminals 27 and 28, the internal terminals 24 and 25, and the like of the package 20.

For the connection between the connection pads of the IC chip 40 and the internal connection terminals 23a, a connection method such as by flip-chip mounting with the IC chip 40 flipped may be used, in addition to a connection method by wire bonding using the metal wires 41.

In the oscillator 6, with a drive signal applied from the IC chip 40 to the excitation electrodes (12b and the like) via the internal connection terminals 23a, the internal terminals 24 and 25, the metal wires 31, and the connection electrodes 18a and 18b, the vibrating arms (11b and the like) of the vibrator element 1 oscillate (resonate) at a predetermined frequency (about 32.768 kHz as an example).

Then, the oscillator 6 outputs an oscillation signal generated with this oscillation to the outside via the IC chip 40, the internal connection terminals 23a, the external terminals 27 and 28, and the like.

As described above, since the oscillator 6 of the third embodiment includes the vibrator element 1, it is possible to provide the oscillator producing the advantageous effect described in the first embodiment.

Also when the oscillator 6 includes the vibrator element 2 instead of the vibrator element 1, it is possible to provide an oscillator producing an advantageous effect similar to the above and the advantageous effect specific to the vibrator element 2.

The oscillator 6 may have a module structure (for example, a structure in which the vibrator and the IC chip are separately mounted on one substrate) in which the IC chip 40 is not incorporated into the package 20 but externally mounted.

Fourth Embodiment

Next, a mobile phone as an electronic apparatus including the vibrator element described in the first embodiment will be described.

Figure 8:
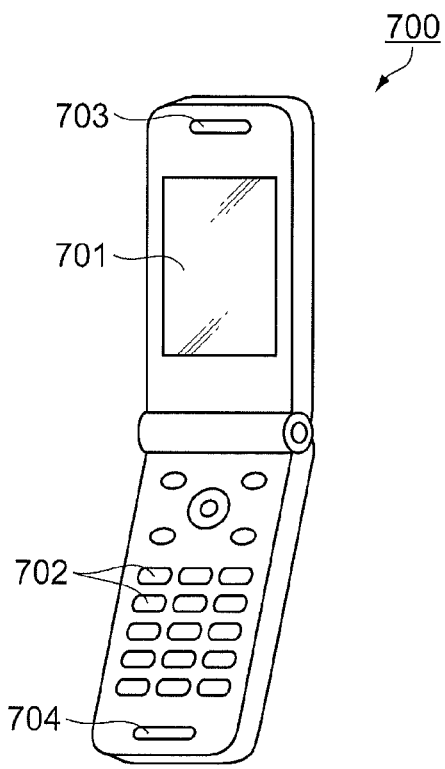
FIG. 8 is a schematic perspective view showing a mobile phone of a fourth embodiment.

FIG. 8 is a schematic perspective view showing a mobile phone of a fourth embodiment.

The mobile phone 700 shown in FIG. 8 is configured to include the vibrator element 1 described in the first embodiment as a reference clock oscillation source or the like, and to further include a liquid crystal display device 701, a plurality of operation buttons 702, an earpiece 703, and a mouthpiece 704. The mobile phone 700 may include the vibrator element 2 instead of the vibrator element 1.

The vibrator element described above can be preferably used as a reference clock oscillation source or the like of an electronic book, a personal computer, a television set, a digital still camera, a video camcorder, a video recorder, a navigation system, a pager, an electronic notebook, a calculator, a word processor, a workstation, a videophone, a POS terminal, a device including a touch panel, or the like, in addition to the mobile phone. In any of these cases, it is possible to provide the electronic apparatus producing the advantageous effect described in the first embodiment.

Fifth Embodiment

Next, an automobile as a moving object including the vibrator element described in the first embodiment will be described.

Figure 9:
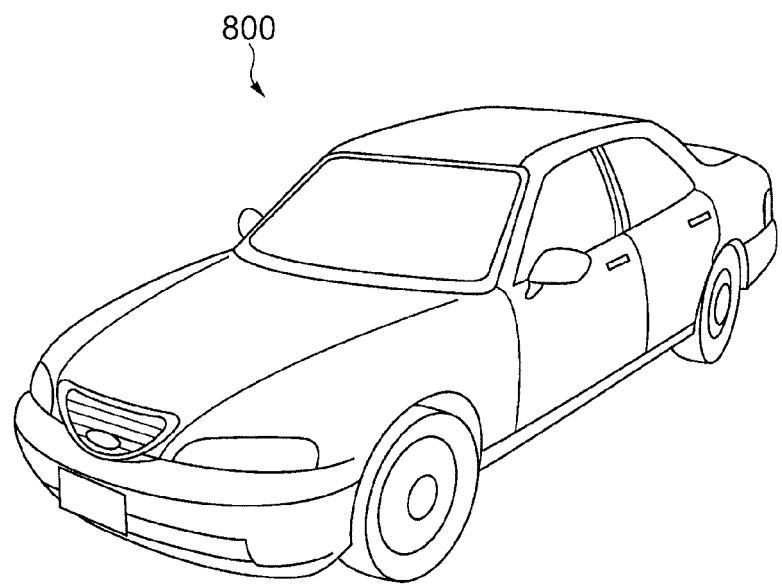
FIG. 9 is a schematic perspective view showing an automobile of a fifth embodiment.

FIG. 9 is a schematic perspective view showing an automobile of a fifth embodiment.

The automobile 800 uses the vibrator element 1 described in the first embodiment as a reference clock oscillation source or the like of, for example, various types of electronic control units (for example, an electronic control fuel injection system, an electronic control ABS system, an electronic control cruise controller, and the like) mounted on the automobile 800. The automobile 800 may include the vibrator element 2 instead of the vibrator element 1.

According to this configuration, since the automobile 800 includes the vibrator element (1 or 2), it is possible to produce the advantageous effect described in the first embodiment and offer superior performance.

The vibrator element described above can be preferably used as a reference clock oscillation source or the like of a moving object including a self-propelled robot, a self-propelled carrier, a train, a ship, an airplane, and an artificial satellite, in addition to the automobile 800. In any of these cases, it is possible to provide the moving object producing the advantageous effect described in the first embodiment.

When quartz crystal is used for the base material of the vibrator element, a Z-cut plate, an X-cut plate, or the like, for example, that is cut from rough quartz crystal or the like at a predetermined angle can be used. When the Z-cut plate is used, etching processing is easy due to the characteristics thereof.

The vibration direction of the vibrator element is not limited to the Z-axis direction (thickness direction), but may be set to, for example, the X-axis direction (direction along the main surface) by providing the excitation electrodes on side surfaces (surfaces connecting the main surfaces to each other) of the vibrating arms (the flexural vibration in this direction is called in-plane vibration).

The number of vibrating arms of the vibrator element is not limited to three, but may be one, two, four, five, or n (n is a natural number of 6 or more).

The thickness of the base portion of the vibrator element may be set to the same thickness as that of the vibrating arm. According to this configuration, since the vibrator element has a plate-like shape, the vibrator element is easily manufactured.

The entire disclosure of Japanese Patent Application No. 2013-150213, filed Jul. 19, 2013 is expressly incorporated by reference herein.

What is claimed is:

1. A vibrator element comprising:
   a base portion;
   a vibrating arm extending from the base portion;
   a first electrode containing TiN and arranged above the vibrating arm;
   a second electrode arranged above the first electrode;
   a piezoelectric body containing AlN and arranged between the first electrode and the second electrode; and
   an insulating film containing $SiO_2$ and arranged between the first electrode and the piezoelectric body, wherein the piezoelectric body is C-axis oriented, the material of the second electrode contains TiN, and the vibrator element has (i) a greater Q value of vibration characteristics with the first electrode containing TiN compared to a same electrode having a composition without TiN and (ii) a greater elasticity with the piezoelectric body containing AlN compared to a same piezoelectric body having a composition without AlN.

2. The vibrator element according to claim 1, wherein the base portion and the vibrating arm contain Si.

3. The vibrator element according to claim 2, wherein a film containing $SiO_2$ is arranged between the vibrating arm and the first electrode, or on a surface of the vibrating arm on the side opposite to the first electrode side.

4. A vibrator comprising:
the vibrator element according to claim 1; and
a package accommodating the vibrator element.

5. An oscillator comprising:
the vibrator element according to claim 1; and
an oscillation circuit causing the vibrator element to oscillate.

6. An electronic apparatus comprising the vibrator element according to claim 1.

7. A moving object comprising the vibrator element according to claim 1.

\* \* \* \* \*